US012813021B2

(12) United States Patent
Huang et al.

(10) Patent No.: US 12,813,021 B2
(45) Date of Patent: Nov. 24, 2026

(54) LIGHT-EMITTING DIODE, LIGHT-EMITTING MODULE, AND DISPLAY DEVICE WITH RECTANGULAR-LIKE ELECTRODE HAVING ARC SIDES

(71) Applicant: XIAMEN SAN'AN OPTOELECTRONICS CO., LTD., Fujian Province (CN)

(72) Inventors: Min Huang, Xiamen (CN); Peng Liu, Xiamen (CN); Yu Zhan, Xiamen (CN); Zhanggen Xia, Xiamen (CN); Su-Hui Lin, Xiamen (CN); Chung-Ying Chang, Xiamen (CN); Anhe He, Xiamen (CN)

(73) Assignee: XIAMEN SAN'AN OPTOELECTRONICS CO., LTD., Fujian Province (CN)

( * ) Notice: Subject to any disclaimer, the term of this patent is extended or adjusted under 35 U.S.C. 154(b) by 960 days.

(21) Appl. No.: 17/873,474

(22) Filed: Jul. 26, 2022

(65) Prior Publication Data

US 2023/0033196 A1 Feb. 2, 2023

(30) Foreign Application Priority Data

Jul. 29, 2021 (CN) ......................... 202110866074.3

(51) Int. Cl.
*H10H 20/831* (2025.01)
*H10H 20/841* (2025.01)
*H10H 20/825* (2025.01)

(52) U.S. Cl.
CPC ........ *H10H 20/831* (2025.01); *H10H 20/841* (2025.01); *H10H 20/8252* (2025.01)

(58) Field of Classification Search
CPC . H10H 20/831; H10H 20/841; H10H 20/8252
See application file for complete search history.

(56) References Cited

U.S. PATENT DOCUMENTS

2018/0069062 A1* 3/2018 Ma ...................... H10K 59/878
2018/0301665 A1* 10/2018 Sakamoto ............ H10K 50/858
2021/0202567 A1* 7/2021 Kim ..................... H10H 20/824
2022/0093825 A1* 3/2022 Cha ...................... H10H 20/835

FOREIGN PATENT DOCUMENTS

CN 112467007 A 3/2021

OTHER PUBLICATIONS

Search Report appended to an Office Action, which was issued to Chinese counterpart application No. 202110866074.3 by the CNIPA on Apr. 7, 2022 with an English translation thereof.

* cited by examiner

*Primary Examiner* — Lex H Malsawma
(74) *Attorney, Agent, or Firm* — MUNCY, GEISSLER, OLDS & LOWE, P.C.

(57) ABSTRACT

A light-emitting diode includes a substrate, a light-emitting unit, an insulating layer, a first contact electrode and a second contact electrode. The insulating layer is disposed on the light-emitting unit, and has a first through hole and a second through hole. The first contact electrode and the second contact electrode pass through the first through hole and the second through hole to be electrically connected to the light-emitting unit, respectively. A projection of one of the first contact electrode and the second contact electrode on the substrate is rectangular-like in shape and has a first arc side and a second arc side that are opposite to each other.

26 Claims, 8 Drawing Sheets

LIGHT-EMITTING DIODE, LIGHT-EMITTING MODULE, AND DISPLAY DEVICE WITH RECTANGULAR-LIKE ELECTRODE HAVING ARC SIDES

CROSS-REFERENCE TO RELATED APPLICATION

This application claims priority of Chinese Invention Patent Application No. 202110866074.3, filed on Jul. 29, 2021, the contents of which are incorporated herein by reference in their entirety.

FIELD

The disclosure relates to a semiconductor lighting device, and more particularly to a light-emitting diode, a light-emitting module, and a display device.

BACKGROUND

Compared to a liquid crystal display (LCD) or an organic light-emitting diode (OLED), a mini/micro light-emitting diode (LED) delivers better performance in terms of brightness, resolution, contrast, energy consumption, service life, response time, and thermal stability. Currently, a size of a distributed Bragg reflection (DBR)-based flip-chip LED is becoming increasingly smaller. As the size of the DBR-based flip-chip LED decreases, the requirement for a pitch of a patterned structure of the DBR-based flip-chip LED becomes higher.

Referring to FIGS. 1A and 1B, a conventional mini/micro flip-chip LED includes a substrate 910, a semiconductor epitaxial structure 920, a first electrode unit, a second electrode unit, a first metal layer 941, a second metal layer 942, and an insulating layer 930.

The semiconductor epitaxial structure 920 is disposed on the substrate 910, and includes a first conductivity type semiconductor layer 921, a light-emitting layer 922 and a second conductivity type semiconductor layer 923 that are disposed on the substrate 910 in such order. The semiconductor epitaxial structure 920 has a recess that extends from the second conductivity type semiconductor layer 923 to the first conductivity type semiconductor layer 921, and that exposes a part of the first conductivity type semiconductor layer 921. The first electrode unit includes a first metal electrode 951, and the second electrode unit includes a second metal electrode 952. The second metal layer 942 and the first metal layer 941 are disposed on the second conductivity type semiconductor layer 923 and the exposed first conductivity type semiconductor layer 921, respectively. The insulating layer 930 is disposed on the second conductivity type semiconductor layer 923, the exposed first conductivity type semiconductor layer 921, the first metal layer 941 and the second metal layer 942, and has a first through hole 931 and a second through hole 932 that penetrate the insulating layer 930 and that respectively terminate at the first metal layer 941 and the second metal layer 942, to expose the first metal layer 941 and the second metal layer 942. The first metal electrode 951 passes through the first through hole 931 to be in contact with the first metal layer 941, and is electrically connected to the exposed first conductivity type semiconductor layer 921 through the first metal layer 941. The second metal electrode 952 passes through the second through hole 932 to be in contact with the second metal layer 942, and is electrically connected to the second conductivity type semiconductor layer 923 through the second metal layer 942.

Referring to FIGS. 1C and 1D, in order to facilitate current spreading in the first metal layer 941 and the second metal layer 942, each of the first metal layer 941 and the second metal layer 942 usually has a first portion having a circular shape and a second portion having a strip-like shape. However, due to a sharp-tip effect, a current easily tends to accumulate at an end of the second portion of the first metal layer 941 and an end of the second portion of the second metal layer 942, thereby burning the second portions of the first metal layer 941 and the second metal layer 942 and further damaging the first electrode unit and the second electrode unit. The abovementioned configuration may lead to aging of the mini/micro flip-chip LED, which in turn may lead to malfunctioning and abnormalities, such as current leakage or dead lamp.

In addition, due to the presence of the first metal layer 941 and the second metal layer 942, there exists a difference in height between a portion of the insulating layer 930 on the first metal layer 941 and the second metal layer 942 and the remaining portion of the insulating layer 930. This difference in height may easily cause fracture of the first metal electrode 951 and the second metal electrode 952 that are formed on the portion of the insulating layer 930 and the first and second metal layers 941, 942.

SUMMARY

Therefore, an object of the disclosure is to provide a light-emitting diode, a light-emitting module and a display device that can alleviate or overcome the aforesaid shortcomings of the prior art.

According to a first aspect of the disclosure, a light-emitting diode includes a substrate, a light-emitting unit, an insulating layer, a first contact electrode, and a second contact electrode.

The light-emitting unit includes a first conductivity type semiconductor layer, a light-emitting layer and a second conductivity type semiconductor layer that are disposed on the substrate in such order. A part of the first conductivity type semiconductor layer is exposed from the light-emitting layer and the second conductivity type semiconductor layer.

The insulating layer is disposed on the light-emitting unit, and has a first through hole and a second through hole that penetrate the insulating layer.

The first contact electrode passes through the first through hole to electrically connect to the exposed first conductivity type semiconductor layer.

The second contact electrode passes through the second through hole to electrically connect to the second conductivity type semiconductor layer.

A projection of one of the first contact electrode and the second contact electrode on the substrate is rectangular-like in shape and has a first arc side and a second arc side that are opposite to each other.

According to a second aspect of the disclosure, a light-emitting module includes the abovementioned light-emitting diode.

According to a third aspect of the disclosure, a display device includes the abovementioned light-emitting module.

BRIEF DESCRIPTION OF THE DRAWINGS

Other features and advantages of the disclosure will become apparent in the following detailed description of the embodiment (s) with reference to the accompanying drawings, in which.

DETAILED DESCRIPTION

Figure 1A:
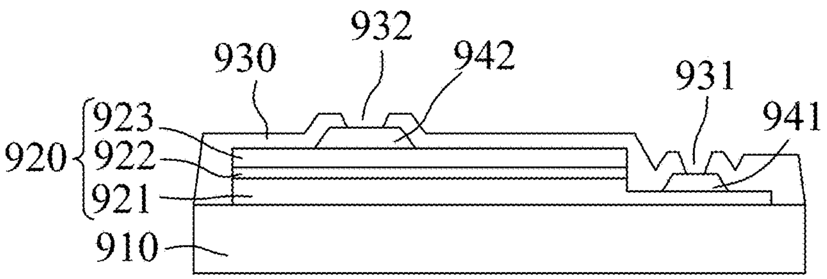
FIG.1A PRIOR ART
FIGS. 1A to 1C are schematic views illustrating a conventional mini/micro light-emitting diode.
Figure 1B:
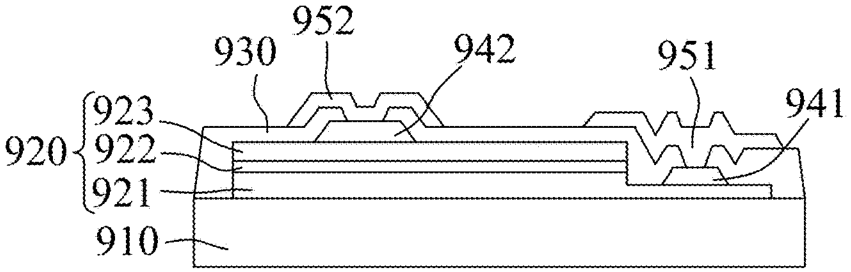
FIG.1B PRIOR ART
Figure 1C:
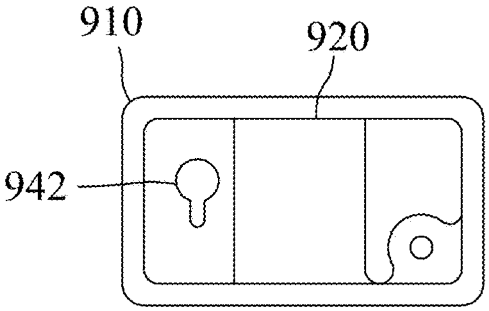
FIG.1C PRIOR ART
Figure 1D:
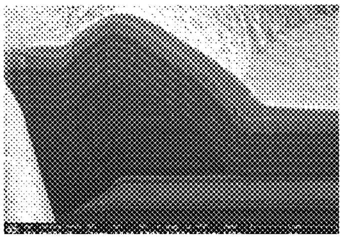
FIG.1D PRIOR ART
FIG. 1D is a picture illustrating a product of the conventional mini/micro light-emitting diode.

Before the disclosure is described in greater detail, it should be noted that where considered appropriate, reference numerals have been repeated among the figures to indicate corresponding or analogous elements, which may optionally have similar characteristics.

It should be noted that, directional terms, such as "vertical," "horizontal," "top," "bottom," "upper," and "lower," may be used to assist in describing the disclosure based on the orientation of the embodiments shown in the figures. The use of these directional definitions should not be interpreted to limit the disclosure in any way.

Referring to FIGS. 2A to 2D, a first embodiment of a light-emitting diode according to the present disclosure includes a substrate 100, a light-emitting unit 200, a first electrode unit, a second electrode unit, a metal layer 400, and an insulating layer 300.

Each of a length, a width and a height of the light-emitting diode may range from 2 μm to 250 μm, such as from 2 μm to 5 μm, from 5 μm to 10 μm, from 10 μm to 20 μm, from 20 μm to 50 μm, from 50 μm to 100 μm, or from 100 μm to 250 μm.

The substrate 100 may be a light-transmissive substrate, an opaque substrate or a translucent substrate. The light-transmissive substrate or the translucent substrate can allow light emitted from the light-emitting unit 200 to pass there-through and be transmitted in a direction distant from the light-emitting unit 200. There are no particular limitations on materials that may be used for forming the light-transmissive substrate or the translucent substrate. One of the light-transmissive substrate and the translucent substrate may be made of one of sapphire, silicon carbide, gallium arsenide, gallium nitride, zinc oxide, gallium phosphide, indium phosphide, germanium, and combinations thereof.

In this embodiment, the light-emitting diode is a flip-chip light-emitting diode, and the substrate 100 is made of sapphire. The substrate 100 has an upper surface and a lower surface opposite to the upper surface. The lower surface of the substrate 100 acts as a light-emitting surface. The light-emitting unit 200 is disposed on the upper surface of the substrate 100.

The light-emitting unit 200 includes a first conductivity type semiconductor layer 210, a light-emitting layer 220 and a second conductivity type semiconductor layer 230 that are disposed on the substrate 100 in such order. The light-emitting unit 200 has a recess 200' that extends from the second conductivity type semiconductor layer 230 to the first conductivity type semiconductor layer 210 to expose a part of the first conductivity type semiconductor layer 210 from the light-emitting layer 220 and the second conductivity type semiconductor layer 230. The light-emitting unit 200 may be made of a gallium nitride-based material or a gallium arsenide-based material. Through material selection of the light-emitting layer 220, the light-emitting unit 200 can emit light having an emission wavelength ranging from 260 nm to 700 nm, such as ultraviolet light, blue light, green light, or red light.

There is no particular limitation on the choice of material or a conductivity type for the first conductivity type semiconductor layer 210, the light-emitting layer 220, and the second conductivity type semiconductor layer 230. In certain embodiments, the first conductivity type semiconductor layer 210 may be an N-type semiconductor layer (e.g., N-type gallium nitride layer) that provides electrons; the light-emitting layer 220 may be a gallium nitride-based quantum well structure that includes a single quantum well or multiple quantum wells; and the second conductivity type semiconductor layer 230 may be a P-type semiconductor layer (e.g., P-type gallium nitride layer) that provides holes. In such cases, the N-type semiconductor layer may be a gallium nitride layer doped with silicon, and the P-type semiconductor layer may be a gallium nitride layer doped with magnesium.

The first electrode unit is electrically connected to the first conductivity type semiconductor layer 210, and the second electrode unit is electrically connected to the second conductivity type semiconductor layer 230. The first electrode unit includes a first contact electrode 510, and the second electrode unit includes a second contact electrode 520.

In this embodiment, each of the first electrode unit and the second electrode unit is made of metal, such as nickel, gold, chromium, titanium, platinum, palladium, rhodium, iridium, aluminum, tin, indium, tantalum, copper, cobalt, iron, ruthenium, zirconium, tungsten, molybdenum, or combinations thereof.

In this embodiment, the first contact electrode 510 is an N-type contact electrode, and the second contact electrode 520 is a P-type electrode. It should be noted that there is no particular limitation on the conductivity type for each of the first contact electrode 510 and the second contact electrode 520.

Figure 2A:
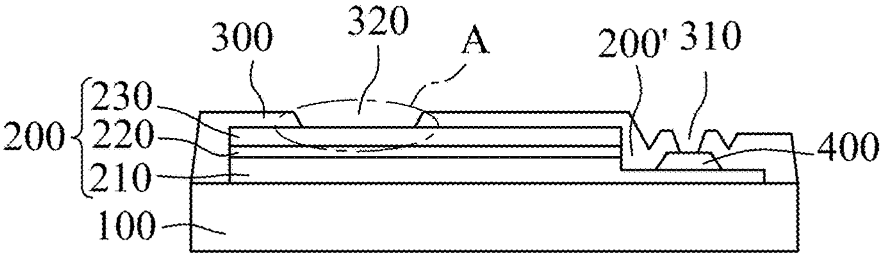
FIGS. 2A to 2C are schematic views illustrating a first embodiment of a light-emitting diode according to the disclosure.
Figure 2B:
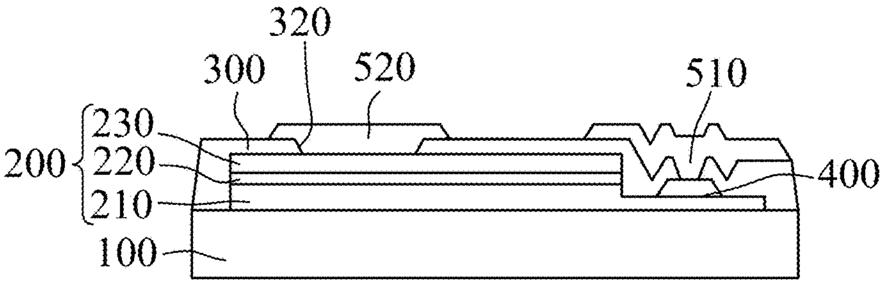
Figure 2C:
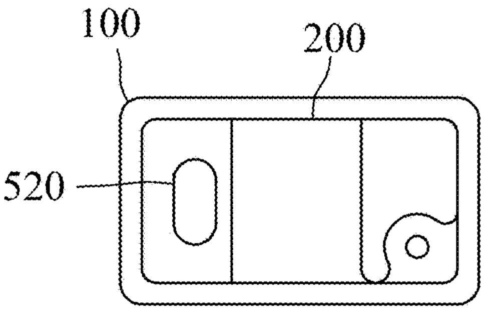
Figure 2D:
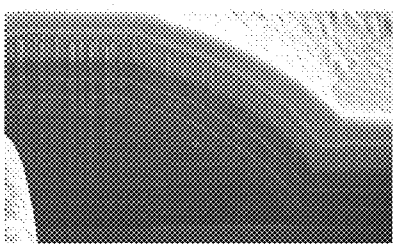
FIG. 2D is a picture illustrating a product of the light-emitting diode of this disclosure.

In this embodiment, as shown in FIG. 2C, a projection of the second contact electrode 520 on the substrate 100 is rectangular-like in shape and has a first arc side and a second arc side that are opposite to each other. In this case, the second contact electrode 520 might not have any sharp point or narrow strip-like portion, so as to mitigate a sharp-tip effect (a current being accumulated at a sharp point of the second contact electrode 520) and a risk of failure of the second contact electrode 520.

The metal layer 400 is disposed between the insulating layer 300 and the light-emitting unit 200. To be specific, the metal layer 400 may be disposed only on the exposed first conductivity type semiconductor layer 210 or only on the second conductivity type semiconductor layer 230. The metal layer 400 may be made of chromium, aluminum, titanium, platinum, or gold. In this embodiment, the metal layer 400 is disposed on the exposed first conductivity type semiconductor layer 210.

The insulating layer 300 is disposed on the light-emitting unit 200 (i.e., the second conductivity type semiconductor layer 230 and the exposed first conductivity type semiconductor layer 210) and the metal layer 400. There is no particular limitation on the choice of material for the insulating layer 300. The insulating layer 300 may include one of silicon dioxide, silicon nitride, aluminum oxide, aluminum nitride, and combinations thereof.

The insulating layer 300 has a first through hole 310 and a second through hole 320 that penetrate the insulating layer 300. The first contact electrode 510 passes through the first through hole 310 to be in direct contact with the metal layer 400, and is electrically connected to the exposed first conductivity type semiconductor layer 210 through the metal layer 400. The second contact electrode 520 passes through the second through hole 320 to be electrically connected to the second conductivity type semiconductor layer 230. The insulating layer 300 has a first hole-defining wall that defines the first through hole 310, and a second hole-defining wall that defines the second through hole 320. It should be noted that a projection of each of the first hole-defining wall and the first contact electrode 510 on the substrate 100 may fall inside a projection of the exposed first conductivity type semiconductor layer 210 on the substrate 100, and a projection of each of the second hole-defining wall and the second contact electrode 520 on the substrate 100 may fall inside a projection of the second conductivity type semiconductor layer 230 on the substrate 100.

Figure 2E:
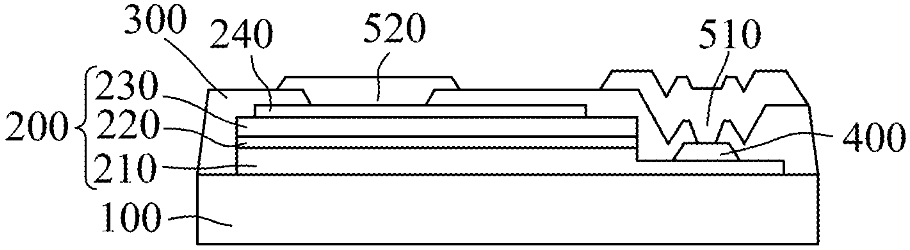
FIGS. 2E and 2F are schematic views illustrating a second embodiment of the light-emitting diode according to the disclosure.
Figure 2F:
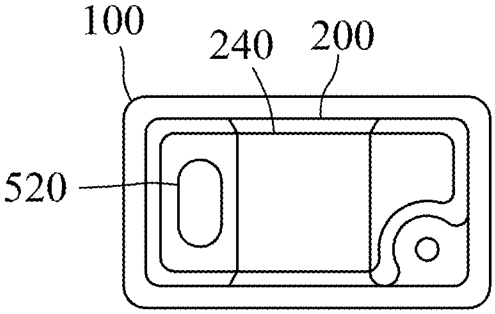

Referring to FIGS. 2E and 2F, a second embodiment of the light-emitting diode according to the present disclosure is similar to the first embodiment in general, except that in the second embodiment, the light-emitting diode further includes a current spreading layer 240 that is disposed between the second conductivity type semiconductor layer 230 and the insulating layer 300, and that is exposed from the insulating layer 300. The second contact electrode 520 is electrically connected to the second conductivity type semiconductor layer 230 through the current spreading layer 240.

The current spreading layer 240 disposed on the second conductivity type semiconductor layer 230 forms an ohmic contact with the second conductivity type semiconductor layer 230. The current spreading layer 240 may cover most of an upper surface of the second conductivity type semiconductor layer 230, e.g., at least 90% of the upper surface of the second conductivity type semiconductor layer 230. The projection of each of the second hole-defining wall and the second contact electrode 520 on the substrate 100 may fall inside a projection of the current spreading layer 240 on the substrate 100. The current spreading layer 240 facilitates lateral current flow in a horizontal direction. The current spreading layer 240 may be a metal oxide layer, and may be light-transmissive. In such case, the current spreading layer 240 could be a transparent conducting layer, and at least a part of light emitted from the light-emitting layer 220 could pass therethrough. There is no particular limitation on the material used for making the current spreading layer 240. The current spreading layer 240 may be made of one of indium tin oxide (ITO), gallium tin oxide (GTO), gallium zinc oxide (GZO), zinc oxide (ZnO), and combinations thereof.

In certain embodiments, the current spreading layer 240 may be disposed between the exposed first conductivity type semiconductor layer 210 and the insulating layer 300, and the first contact electrode 510 is electrically connected to the exposed first conductivity type semiconductor layer 210 through the current spreading layer 240. In such case, the metal layer 400 is not disposed on the exposed first conductivity type semiconductor layer 210.

Figure 3A:
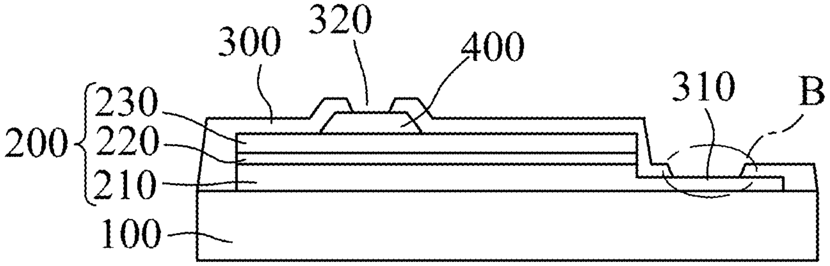
FIGS. 3A to 3C are schematic views illustrating a third embodiment of the light-emitting diode according to the disclosure.
Figure 3B:
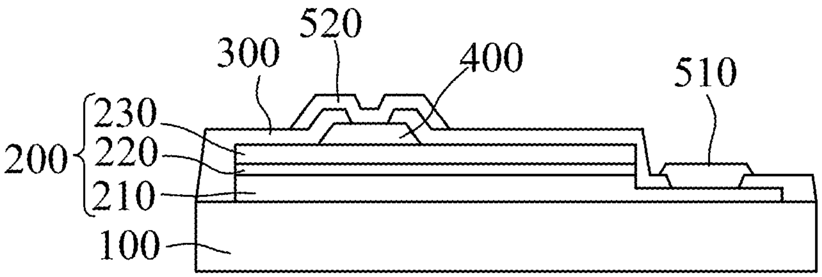
Figure 3C:
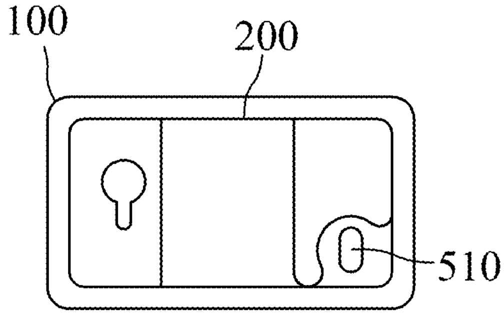

Referring to FIGS. 3A to 3C, a third embodiment of the light-emitting diode according to the present disclosure is similar to the first embodiment in general, except for the following differences: the metal layer 400 is disposed between the second conductivity type semiconductor layer 230 and the insulating layer 300; the first contact electrode 510 passes through the first through hole 310 to be in direct contact with and to be electrically connected to the exposed first conductivity type semiconductor layer 210; and a projection of the first contact electrode 510 on the substrate 100 is rectangular-like in shape and has a first arc side and a second arc side that are opposite to each other. In such case, the first contact electrode 510 might not have any sharp point, which may mitigate the sharp-tip effect (a current being accumulated at a sharp point of the first contact electrode 510) and a risk of failure of the first contact electrode 510.

Figure 4A:
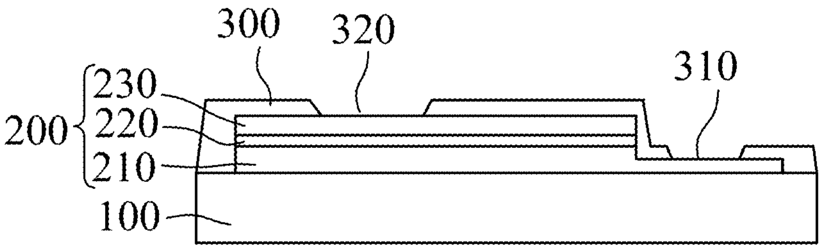
FIGS. 4A to 4C are schematic views illustrating a fourth embodiment of the light-emitting diode according to the disclosure.
Figure 4B:
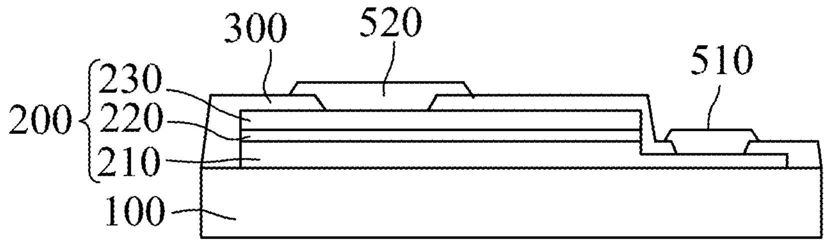
Figure 4C:
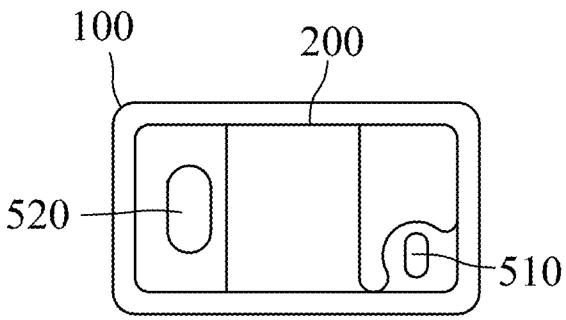

Referring to FIGS. 4A to 4C, a fourth embodiment of the light-emitting diode according to the present disclosure is similar to the first embodiment in general, except that in the fourth embodiment, the light-emitting diode does not include the metal layer 400, and the projection of the first contact electrode 510 and the second contact electrode 520 on the substrate 100 are both rectangular-like in shape. In such case, each of the first contact electrode 510 and the second contact electrode 520 might not have any sharp point, which may mitigate the sharp-tip effect and the risk of failure of the first contact electrode 510 and the second contact electrode 520. In addition, without the metal layer 400 that is disposed between the insulating layer 300 and the exposed first conductivity type semiconductor layer 210 and between the insulating layer 300 and the second conductivity type semiconductor layer 210, a poor coverage of the light-emitting unit 200 by the insulating layer 300 may be avoided and a difference in height that may exist between a portion of the insulating layer 300 on the metal layer 400 and the remaining portion of the insulating layer 300 may be eliminated, so that the first contact electrode 510 and/or the second contact electrode 520 may properly cover the insulating layer 300 and the light-emitting unit 200, thereby effectively reducing a risk of fracture of the first contact electrode 510 and/or the second contact electrode 520. In addition, a location of each of the first through hole 310 and the second through hole 320 would no longer be limited by a location of the metal layer 400, thereby reducing the level of difficulty of etching the first through hole 310 and the second through hole 320 and enhancing the production efficiency of the light-emitting diode. Each of the first hole-defining wall and the second hole-defining wall of the insulating layer 300 may have a gentle slope, thereby reducing the risk of fracture of the first contact electrode 510 and the second contact electrode 520, improving the coverage of the first contact electrode 510 and the second contact electrode 520, significantly enhancing protection of the light-emitting diode against electrostatic discharge (ESD), and decreasing the speed of aging of the light-emitting diode. In certain embodiments, each of the first hole-defining wall and the second hole-defining wall of the insulating layer 300 may be formed as one of a straight wall and a slanted wall.

Figure 4D:
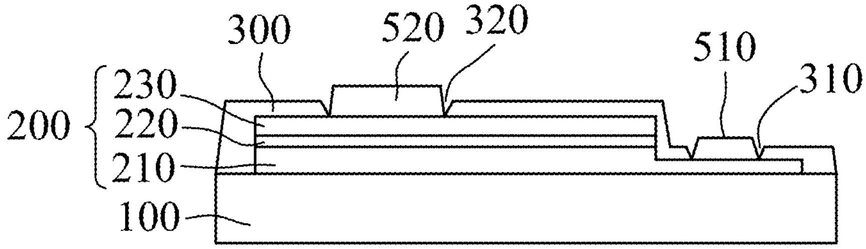
FIG. 4D is a schematic view illustrating a shape of each of a first contact electrode and a second contact electrode not being in correspondence with a shape of a respective one of a first through hole and a second through hole.

It should be noted that the first contact electrode 510 and the second contact electrode 520 are disposed on the insulating layer 300 and fill the first through hole 310 and the second through hole 320, respectively. However, in certain embodiments, the first contact electrode 510 and the second contact electrode 520 may only respectively fill the first through hole 310 and the second through hole 320 instead. Specifically, a photoresist layer is deposited on the insulating layer 300, the insulating layer 300 is patterned to form the first through hole 310 and the second through hole 320 using the photoresist layer as a mask, a contact electrode material layer is formed on a patterned photoresist layer and fills the first through hole 310 and the second through hole 320, and then the patterned photoresist layer is removed, so as to form the first contact electrode 510 and the second contact electrode 520 that only fill the first through hole 310 and the second through hole 320, respectively. In this case, a shape of the first contact electrode 510 is in correspondence with that of the first through hole 310, and a shape of the second contact electrode 520 is in correspondence with that of the second through hole 320. In certain embodiments; however, as shown in FIG. 4D, it may also be that the shape of the first contact electrode 510 is not in correspondence with that of the first through hole 310, and the shape of the second contact electrode 520 is not in correspondence with that of the second through hole 320.

Figure 5:
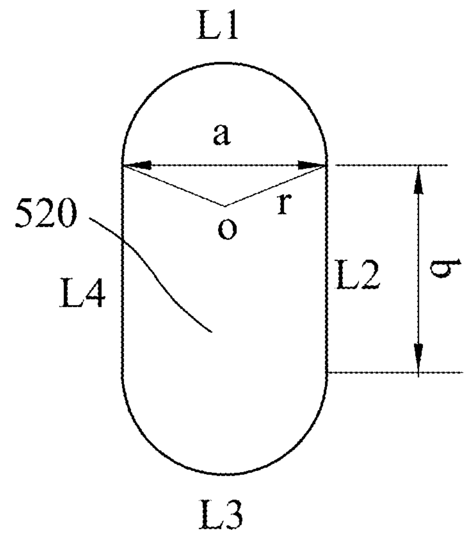
FIG. 5 is a schematic view illustrating a projection of a second contact electrode of the light-emitting diode on a substrate of the light-emitting diode being rectangular-like in shape.

Referring to FIG. 5, the projection further has a first linear side L2 and a second linear side L4 that are opposite to each other, and the first arc side L1, the first linear side L2, the second arc side L3, and the second linear side L4 are arranged in such order in a clockwise direction.

One of the first arc side L1 and the second arc side L3 may be a portion of a circumference of a circle or an ellipse. Since the projections of the first contact electrode 510 and the second contact electrode 520 on the substrate 100 are both rectangular-like in shape, sharp points of each of the first contact electrode 510 and the second contact electrode 520 may be eliminated, which is conducive to uniform current distribution in each of the first contact electrode 510 and the second contact electrode 520.

In certain embodiments, the first arc side L1 and the second arc side L3 of the first contact electrode 510 are symmetrical with each other based on a perpendicular bisector that is perpendicular to a lengthwise direction of the first contact electrode 510, and the first linear side L2 and the second linear side L4 are symmetrical with each other based on a perpendicular bisector that is perpendicular to a widthwise direction of the first contact electrode 510. In certain embodiments, the first arc side L1 and the second arc side L3 of the second contact electrode 520 are symmetrical with each other based on a perpendicular bisector that is perpendicular to a lengthwise direction of the second contact electrode 520, and the first linear side L2 and the second linear side L4 are symmetrical with each other based on a perpendicular bisector that is perpendicular to a widthwise direction of the second contact electrode 520.

The first arc side L1 and the second arc side L3 are symmetrical with each other and are the same in arc length and degree of curvature. The first linear side L2 and the second linear side L4 are symmetrical with each other and are the same in length. For example, when each of the first arc side L1 and the second arc side L3 is a portion of a circumference of a circle having a radius (r) and a central angle corresponding thereto, the radius (r) and the central angle corresponding to the first arc side L1 are the same as those of the second arc side L3. For another example, the first linear side L2 and the second linear side L4 have the same length. When the first arc side L1 and the second arc side L3 are symmetrical with each other, and the first linear side L2 and the second linear side L4 are symmetrical with each other, the rectangular-like shape becomes an axially symmetrical shape, which is conducive to a more uniform current distribution in each of the first contact electrode 510 and the second contact electrode 520.

In certain embodiments, a distance (a) between the first linear side L2 and the second linear side L4 is not greater than a length (b) of each of the first linear side L2 and the second linear side L4.

In certain embodiments, the contact electrode(s) (either the first contact electrode 510, the second contact electrode 520, or both) the projection of which on the substrate 100 is rectangular-like in shape has a rectangular-like body portion having two opposite flat side faces that respectively correspond to the first linear side L2 and the second linear side L4 of the projection, and two opposite curved side faces that respectively correspond to the first arc side L1 and the second arc side L3. In an embodiment, one of the flat side faces of the rectangular body portion of one of the first contact electrode 510 and the second contact electrode 520 is located proximate to and faces the other one of the first contact electrode 510 and the second contact electrode 520.

When the one of the flat side faces of the rectangular body portion of the second contact electrode 520 is located proximate to and faces the first contact electrode 510, and the distance (a) is not greater than the length (b), the flat side faces are wider than the curved side faces, a current then easily spreads on the flat side face of the rectangular body portion that is located proximate to and faces the first contact electrode 510. On the other hand, when one of the curved side faces is located proximate to and faces the first contact electrode 510, the current would easily accumulate on the curved side face.

Likewise, when one of the flat side faces of the rectangular body portion of the first contact electrode 510 is located proximate to and faces the second contact electrode 520, and the distance (a) is not greater than the length (b), the flat side faces of the rectangular body portion are wider than the curved side faces, a current then easily spreads on the side face of the rectangular body portion that is located proximate to and faces the second contact electrode 520. On the other hand, when one of the curved side faces of the first contact electrode 510 is located proximate to and faces the second contact electrode 520, the current would easily accumulate on the curved side face.

In certain embodiments, the ratio of the distance (a):the length (b) ranges from 1:1 to 1:5, and the ratio of the distance (a):the radius (r) ranges from 1:0.5 to 1:2. In other words, the distance (a):the length (b):the radius (r) ranges from 1:(1-5):(0.5-2). Such ratio range may further facilitate current spreading of the flat side surface(s). In certain embodiments, the first arc side L1, the second arc side L3, the first linear side L2 and the second linear side L4 are designed to be smooth, which is conducive for effectively preventing the sharp-tip effect. It is noted that an arc length of each of the first arc side L1 and the second arc side L3 may not be equal to the distance (a).

In certain embodiments, a ratio of an area of the projection of the second contact electrode 520 on the substrate 100 to an area of a projection of the light-emitting layer 220 on the substrate 100 may range from 9% to 30%, which is conducive to a uniform current distribution in the second contact electrode 520 and facilitates reduction of the risk of failure of the second contact electrode 520 without adversely affecting a luminous efficiency of the light-emitting diode.

Likewise, a ratio of an area of the projection of the first contact electrode 510 on the substrate 100 to an area of a projection of the light-emitting layer 220 on the substrate 100 may range from 9% to 30%.

In certain embodiments, when the first contact electrode 510 is an N-type contact electrode and the second contact electrode 520 is a P-type contact electrode, the area of the projection of the second contact electrode 520 on the substrate 100 is greater than the area of the projection of the first contact electrode 510 on the substrate 100, which is conducive to increasing a light-emitting area of the light-emitting diode.

The shape of each of the first contact electrode 510 and the second contact electrode 520 may vary depending on the shape of a respective one of the first through hole 310 and the second through hole 320.

In certain embodiments, the first through hole 310 is formed by etching the insulating layer 300, and has a rectangular-like shape with at least two arc sides. The shape of the first contact electrode 510 that passes through the first through hole 310 is in correspondence with that of the first through hole 310, so as to avoid the sharp-tip effect and reduce the risk of failure of the first contact electrode 510.

Likewise, in certain embodiments, the second through hole 320 is formed by etching the insulating layer 300, and has a rectangular-like shape with at least two arc sides. The shape of the second contact electrode 520 that passes through the second through hole 320 is in correspondence with that of the second through hole 320, so as to avoid the sharp-tip effect and reduce the risk of failure of the second contact electrode 520.

In certain embodiments, a ratio of an area of the projection of the second through hole 320 on the substrate 100 to the area of the projection of the light-emitting layer 220 on the substrate 100 may range from 9% to 30%.

Likewise, in certain embodiments, a ratio of an area of the projection of the first through hole 310 on the substrate 100 to the area of the projection of the light-emitting layer 220 on the substrate 100 may range from 9% to 30%.

Each of the first through hole 310 and the second through hole 320 has a top opening away from the light-emitting unit 200, and a bottom opening opposite to the top opening and adjacent to the light-emitting unit 200. In certain embodiments, when the first contact electrode 510 is the N-type contact electrode and the second contact electrode 520 is the P-type contact electrode, an area of the top opening of the second through hole 320 is greater than that of the top opening of the first through hole 310, which is conducive for increasing the light-emitting area of the light-emitting diode.

Figure 6A:
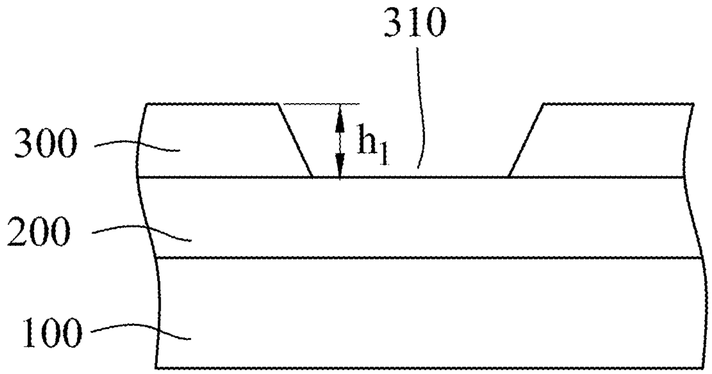
FIG. 6A is a partially enlarged view of FIG. 3A.

In certain embodiments, as shown in FIG. 6A, when the first contact electrode 510 is the N-type contact electrode, the first through hole 310 may have a depth (h1) that is no greater than 3 μm, which is conducive to the first hole-defining wall that defines the first through hole 310 having a gentle slope, to improvement on the coverage of the first contact electrode 510, and to reduction of the risk of fracture of the first contact electrode 510. Likewise, the second through hole 320 may also have a depth that is no greater than 3 μm.

In certain embodiments, when one or each of the first hole-defining wall and the second hole-defining wall has a slanted surface with a constant slope or a varying slope, for one or each of the first hole-defining wall and the second hole-defining wall, the top opening and the bottom opening may be of different sizes.

Figure 6B:
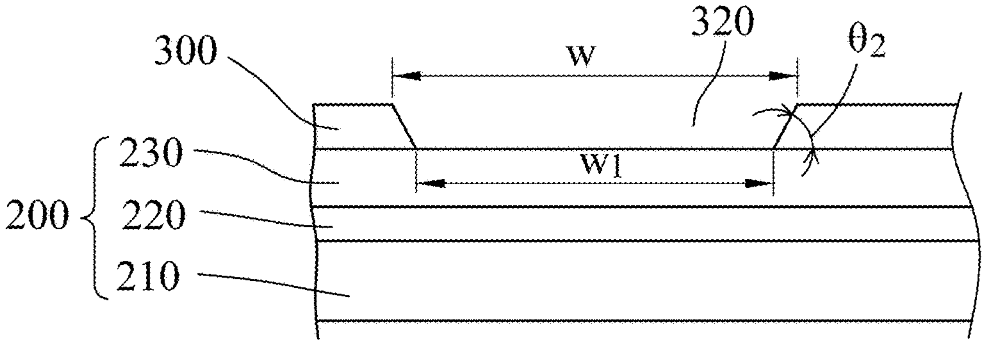
FIG. 6B is a partially enlarged view of FIG. 2A.

In certain embodiments, as shown in FIG. 6B, for the second through hole 320, a ratio of a width (W) of the top opening to a width ($W_1$) of the bottom opening may range from 1.3 to 1.7, so that the second contact electrode 520 can effectively be in contact with the second conductivity type semiconductor layer 230, which is conducive for increasing an electrical conductivity between the second contact electrode 520 and the second conductivity type semiconductor layer 230.

Likewise, for the first through hole 310, a ratio of a width of the top opening to a width of the bottom opening may range from 1.3 to 1.7.

In certain embodiments, as shown in FIG. 6B, when the slope of the second hole-defining wall is constant, a second included angle ($\theta_2$) defined by the second hole-defining wall and a bottom wall of the insulating layer 300 intersecting the second hole-defining wall may range from 10° to 45°. For examples, the second included angle ($\theta_2$) may range from 10° to 30° or from 30° to 45°. There are no particular limitations on the material or the process used for making the insulating layer 300. The insulating layer 300 may be a silicon dioxide ($SiO_2$) layer that is formed by a plasma-enhanced chemical vapor deposition (PECVD) process. In such case, the slope of the second hole-defining wall defined by the insulating layer 300 may be smaller.

Likewise, when the slope of the first hole-defining wall is constant, a first included angle ($\theta_1$) defined by the first hole-defining wall and the bottom wall intersecting the first hole-defining wall may range from 10° to 45°.

Figure 6C:
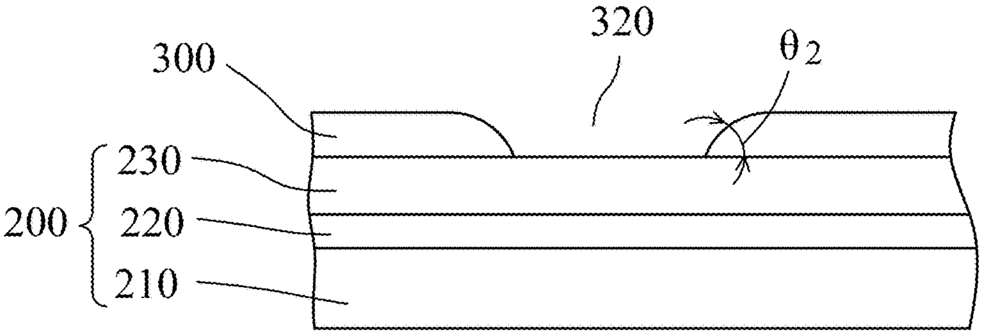
FIG. 6C is a schematic view illustrating a second hole-defining wall that defines the second through hole and that has a decreasing slope in a direction from the substrate of the light-emitting diode to an insulating layer of the light-emitting diode.

In certain embodiments, as shown in FIG. 6C, when the slope of the second hole-defining wall varies, the second included angle ($\theta_2$) decreases in a direction from the substrate 100 to the insulating layer 300 and ranges from 20° to 70°, such as from 20° to 40°, from 40° to 60° or from 60° to 70°. The insulating layer 300 may be a distributed Bragg reflector (DBR), and may include at least one of a silicon oxide ($SiO_2$) layer, a silicon nitride ($Si_3N_4$) layer, an aluminum oxide ($Al_2O_3$) layer, an aluminum nitride (AlN) layer, or a titanium oxide ($TiO_2$) layer. The insulating layer 300 may be formed with the second through hole 320 by wet etching or dry etching.

Figure 6D:
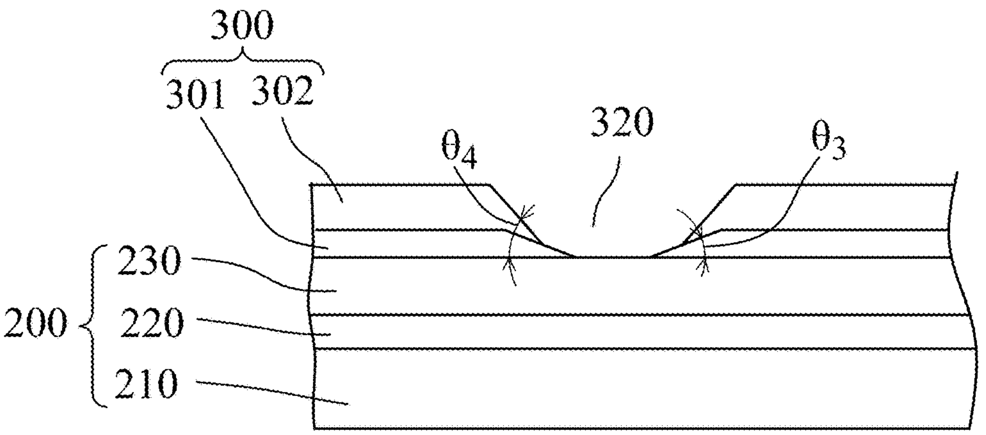
FIG. 6D is a schematic view illustrating the second hole-defining wall forming as a curve-like structure.

When the insulating layer 300 is the DBR, the insulating layer 300 may include multiple paired layer units, each of which includes at least two insulating sublayers that are sequentially stacked on the light-emitting unit 200. As shown in FIG. 6D, the at least two insulating sublayers in each pair unit contain a first insulating sublayer 301 and a second insulating sublayer 302 that have different refractive indices. Each of the first insulating sublayer 301 and the second insulating sublayer 302 may have an optical thickness that is equal to or close to a quarter of an emission wavelength of light emitted from the light-emitting layer 220. The reflectance of the insulating layer 300 with respect to light emitted from the light-emitting layer 220 is no smaller than 80%, 90% or 99%. The insulating layer 300 does not have an absorption characteristic of a metal reflection mirror, and an energy gap of the insulating layer 300 can be adjusted by changing a refractive index or a thickness of the insulating layer 300. In certain embodiments, the refractive index of the first insulating sublayer 301 is greater than that of the second insulating sublayer 302. In such case, the first insulating sublayer 301 may be made of one of titanium oxide ($TiO_2$), niobium pentoxide ($NB_2O_5$), tantalum pentoxide ($TA_2O_5$), hafnium oxide ($HfO_2$), zirconia ($ZrO_2$), and combinations thereof. The second insulating sublayer 302 may be made of one of silicon dioxide ($SiO_2$), magnesium fluoride ($MgF_2$), aluminum oxide ($Al_2O_5$), and combinations thereof.

Likewise, the slope of the first hole-defining wall may vary as the second hole-defining wall, and descriptions thereof are omitted herein for brevity.

In certain embodiments, the insulating layer 300 may include a plurality of insulating sublayers that are sequentially stacked on the light-emitting unit 200 and that may have different refractive indices. A number of the insulating sublayers of the insulating layer 300 may be no less than 2, and the insulating sublayers of the insulating layer 300 may have etching rates that decrease in a direction from the substrate 100 to the insulating layer 300, which is conducive to the first hole-defining wall and/or the second hole-defining wall having a gentle slope.

The etching rates of the insulating sublayers of the insulating layer 300 may vary depending on the material of the insulating layer 300. Because the etching rate of the first insulating sublayer 301 is lower than that of the second insulating sublayer 302, the first hole-defining wall and/or the second hole-defining wall may be composed of two wall surfaces with different slopes and may be formed as a stepwise structure.

The two wall surfaces include a first wall surface formed by the first insulating sublayer 301, and a second wall surface formed by the second insulating sublayer 302. The first wall surface is proximate to a geometry center of the second through hole 320 relative to the second wall surface. The first insulating sublayer 301 may be an aluminum oxide ($Al_2O_3$) layer that is formed using an atomic deposition technique, and the second insulating sublayer 302 may be a silicon oxide ($SiO_2$) layer that is formed using an atomic deposition technique. The included angle ($\theta_3$) defined by the first wall surface and a bottom wall of the insulating layer 300 is smaller than an included angle ($\theta_4$) defined by the second wall surface and the bottom wall of the insulating layer 300. In certain embodiments, the included angle ($\theta_3$) is smaller than 30°, which is conducive for improving the coverage of the second contact electrode 520 and reducing the risk of fracture of the second contact electrode 520.

Because the process cost of wet etching is lower than that of dry etching, and the slope of the first hole-defining wall and/or the second hole-defining wall formed by wet etching the insulating layer 300 is smaller, the forming of the first hole-defining wall or the second hole-defining wall is usually accomplished by wet etching, so as to reduce the manufacturing cost of the light-emitting diode effectively.

This disclosure also provides a light-emitting module which includes the light-emitting diode as mentioned above.

This disclosure also provides a display device which includes the light-emitting module as mentioned above.

In certain embodiments, the light-emitting diode may be applied in a variety of fields, such as chip on board (COB), a lighting device, an ultraviolet lamp, a flexible filament or a backlight.

It should be noted that when the projection of one of the first contact electrode 510 and the second contact electrode 520 on the substrate 100 has the shape of a circle or an ellipse, the sharp-tip effect thereof may not be mitigatable.

The disclosure will be further described by way of the following examples. However, it should be understood that the following examples are solely intended for the purpose of illustration and should not be construed as limiting the disclosure in practice.

Example 1

Figure 7A:
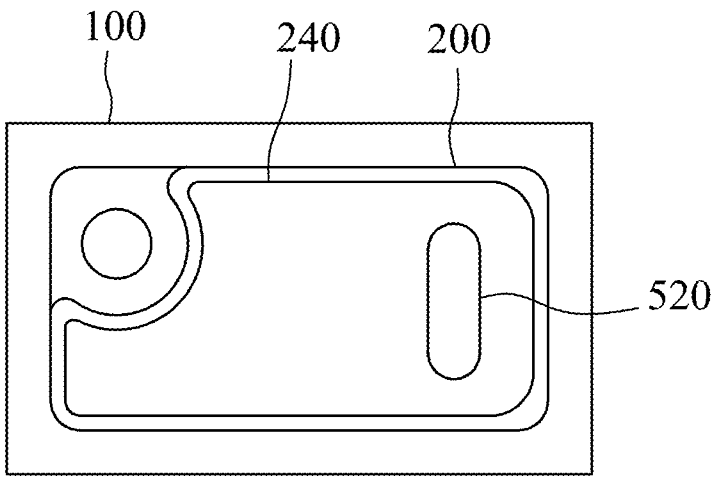
FIG. 7A is a schematic top view illustrating an example of the second contact electrode.

A light-emitting diode of Example 1 having a structure shown in FIG. 7A is prepared, in which a projection of a second contact electrode 520 on the substrate 100 is rectangular-like in shape. In Example 1, the projection has a first arc side, a first linear side, a second arc side, and a second linear side that are arranged in such order in a clockwise direction, wherein the first arc side and the second arc side are opposite to each other and the first linear side and the second linear side are opposite to each other.

Example 2

Figure 7B:
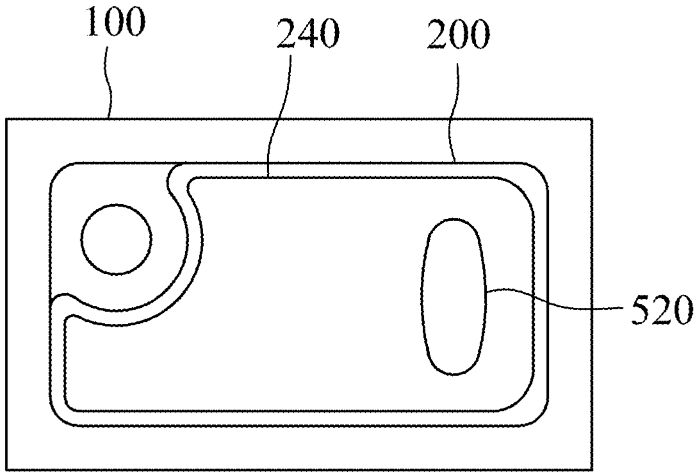
FIG. 7B is a schematic top view illustrating another example of the second contact electrode.

A light-emitting diode of Example 2 having a structure shown in FIG. 7B is prepared. The light-emitting diode of Example 2 is similar to the light-emitting diode of Example 1 in general, except that in Example 2, each of the first linear side and the second linear side of the projection of the second contact electrode 520 is slightly curved.

Current Distribution and Density Simulation Tests

The current distribution and density of each of the second contact electrodes 520 of the light-emitting diodes of Examples 1 and 2 are simulated using a COMSOL software. Each of the light-emitting diodes of Examples 1 and 2 has an area of 0.6 mil×10 mil.

The result shows that the second contact electrode 520 in Example 1 has a uniform current spreading and a current density that is no greater than $3.1\times10^6$ A/$m^2$. The second contact electrode 520 in Example 2 has an even more uniform current spreading and a current density that is no greater than $2.7\times10^6$ A/$m^2$.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode, comprising:

a substrate;

a light-emitting unit including a first conductivity type semiconductor layer, a light-emitting layer, and a second conductivity type semiconductor layer that are disposed on said substrate in such order, a part of said first conductivity type semiconductor layer being exposed from said light-emitting layer and said second conductivity type semiconductor layer;

an insulating layer disposed on said light-emitting unit, and having a first through hole and a second through hole that penetrate said insulating layer;

a first contact electrode passing through said first through hole to be electrically connected to said exposed first conductivity type semiconductor layer; and a second contact electrode passing through said second through hole to be in direct contact with and to be electrically connected to said second conductivity type semiconductor layer, wherein a projection of one of said first contact electrode and said second contact electrode on said substrate has a first arc side and a second arc side that are opposite to each other, wherein the projection of the one of said first contact electrode and said second contact electrode on said substrate further has a first linear side and a second linear side that are opposite to each other, said first arc side, said first linear side, said second arc side, and said second linear side being connected in such order in a clockwise direction, wherein each of said first linear side and said second linear side of the projection of the one of said first contact electrode and said second contact electrode on said substrate is slightly curved.

2. The light-emitting diode of claim 1, further comprising a metal layer that is disposed between said insulating layer and said light-emitting unit.

3. The light-emitting diode of claim 1, wherein said first arc side and said second arc side are symmetrical with each other, and said first linear side and said second linear side are symmetrical with each other.

4. The light-emitting diode of claim 3, wherein a distance (a) between said first linear side and said second linear side is no greater than a length (b) of each of said first linear side and said second linear side.

5. The light-emitting diode of claim 4, wherein each of said first arc side and said second arc side is a portion of a circumference of a circle having a radius (r), a:b ranging from 1:1 to 1:5, a:r ranging from 1:0.5 to 1:2.

6. The light-emitting diode of claim 1, wherein one of said first contact electrode and said second contact electrode includes a rectangular body portion having two opposite side faces that respectively correspond to said first linear side and said second linear side of said projection, one of said side faces of said rectangular body portion being located proximate to and facing the other one of said first contact electrode and said second contact electrode.

7. The light-emitting diode of claim 1, further comprising a current spreading layer that is disposed between said second conductivity type semiconductor layer and said insulating layer, said second contact electrode being electrically connected to said second conductivity type semiconductor layer through said current spreading layer.

8. The light-emitting diode of claim 1, wherein a ratio of an area of the projection to an area of a projection of said light-emitting layer on said substrate ranges from 9% to 30%.

9. The light-emitting diode of claim 1, wherein projections of said first contact electrode and said second contact electrode are both rectangular-like in shape, and a ratio of an area of each of the projections of said first contact electrode and said second contact electrode on said substrate to an area of a projection of said light-emitting layer on said substrate ranges from 9% to 30%.

10. The light-emitting diode of claim 1, wherein a shape of said first contact electrode is in correspondence with that of said first through hole, and a shape of said second contact electrode is in correspondence with that of said second through hole.

11. The light-emitting diode of claim 1, wherein a shape of said first contact electrode is in correspondence with that of said first through hole.

12. The light-emitting diode of claim 1, wherein a shape of said second contact electrode is in correspondence with that of said second through hole.

13. The light-emitting diode of claim 1, wherein each of said first through hole and said second through hole has a top opening away from said light-emitting unit, and a bottom opening opposite to said top opening and adjacent to said light-emitting unit, for said first through hole, a ratio of a width of said top opening to a width of said bottom opening ranging from 1.3 to 1.7, and for said second through hole, a ratio of a width of said top opening of said second through hole to a width of said bottom opening of said second through hole ranging from 1.3 to 1.7.

14. The light-emitting diode of claim 1, wherein said first through hole has a top opening away from said light-emitting unit, and a bottom opening opposite to said top opening and adjacent to said light-emitting unit, a ratio of a width of said top opening to a width of said bottom opening ranging from 1.3 to 1.7.

15. The light-emitting diode of claim 1, wherein said second through hole has a top opening away from said light-emitting unit, and a bottom opening opposite to said top opening and adjacent to said light-emitting unit, a ratio of a width of said top opening to a width of said bottom opening ranging from 1.3 to 1.7.

16. The light-emitting diode of claim 1, wherein said insulating layer has a bottom wall, a first hole-defining wall that defines said first through hole and a second hole-defining wall that defines said second through hole, a first included angle defined by said first hole-defining wall and said bottom wall ranges from 10° to 45°, and a second included angle defined by said second hole-defining wall and said bottom wall ranges from 10° to 45°.

17. The light-emitting diode of claim 1, wherein said insulating layer has a bottom wall and a first hole-defining wall that defines said first through hole, a first included angle defined by said first hole-defining wall and said bottom wall ranging from 10° to 45°.

18. The light-emitting diode of claim 1, wherein said insulating layer has a bottom wall and a second hole-defining wall that defines said second through hole, a second included angle defined by said second hole-defining wall and said bottom wall ranging from 10° to 45°.

19. The light-emitting diode of claim 1, wherein said insulating layer has a bottom wall, a first hole-defining wall that defines said first through hole and a second hole-defining wall that defines said second through hole, a first included angle defined by said first hole-defining wall and said bottom wall, and a second included angle defined by said second hole-defining wall and bottom wall, each of said first included angle and said second included angle decreasing in a direction from said substrate to said insulating layer and ranging from 20° to 70°.

20. The light-emitting diode of claim 1, wherein said insulating layer has a bottom wall and a first hole-defining wall that defines said first through hole, a first included angle defined by said first hole-defining wall and said bottom wall decreasing in a direction from said substrate to said insulating layer and ranging from 20° to 70°.

21. The light-emitting diode of claim 1, wherein said insulating layer has a bottom wall and a second hole-defining wall that defines said second through hole, a second included angle defined by said second hole-defining wall and said bottom wall decreasing in a direction from said substrate to said insulating layer and ranging from 20° to 70°.

22. The light-emitting diode of claim 1, wherein said insulating layer is a distributed Bragg reflector (DBR), and includes at least one of a silicon oxide ($SiO_2$) layer, a silicon nitride ($Si_3N_4$) layer, an aluminum oxide ($Al_2O_3$) layer, an aluminum nitride (AlN) layer, or a titanium oxide ($TiO_2$) layer.

23. The light-emitting diode of claim 1, wherein said insulating layer includes at least two insulating sublayers that are sequentially stacked on said light-emitting unit, said at least two insulating sublayers having etching rates that decrease in a direction from said substrate to said insulating layer.

24. A light-emitting module, comprising the light-emitting diode as claimed in claim 1.

25. A display device, comprising the light-emitting module as claimed in claim 24.

26. The light-emitting diode of claim 1, wherein each of said first linear side and said second linear side of the projection of the one of said first contact electrode and said second contact electrode on said substrate is slightly convex.

* * * * *